United States Patent [19]
Chiang

[11] Patent Number: 5,506,878
[45] Date of Patent: Apr. 9, 1996

[54] PROGRAMMABLE CLOCK HAVING PROGRAMMABLE DELAY AND DUTY CYCLE BASED ON A USER-SUPPLIED REFERENCE CLOCK

[75] Inventor: David Chiang, Saratoga, Calif.

[73] Assignee: Xilinx, Inc., San Jose, Calif.

[21] Appl. No.: 277,382

[22] Filed: Jul. 18, 1994

[51] Int. Cl.$^6$ .................................................. H03K 21/08
[52] U.S. Cl. ............................ 377/39; 377/55; 377/56; 327/151
[58] Field of Search .............................. 377/39, 55–56; 327/151

[56] References Cited

U.S. PATENT DOCUMENTS

| | | | |
|---|---|---|---|
| 4,322,643 | 3/1982 | Preslar | 307/528 |
| 4,754,163 | 6/1988 | Aue et al. | 377/39 |
| 4,809,221 | 2/1989 | Magliocco et al. | 377/39 |
| 5,109,394 | 4/1992 | Hjerpe et al. | 375/119 |
| 5,173,617 | 12/1992 | Alsup et al. | 307/269 |
| 5,345,489 | 9/1994 | Saitoh | 377/39 |

OTHER PUBLICATIONS

Alex Waizman, "A Delay Line Loop for Frequency Synthesis of De-Skewed Clock", pp. 298–299, ISSCC94/Session 18/High-Performance Logic and Circuit Techniques/Paper FA 18.5, IEEE International Solid-State Circuits Conference, 1994.

Thomas H. Lee, Kevin Donnelly, John Ho, Jared Zerbe, Mark Johnson, and Toru Ishikawa, "A 2.5V Delay-Locked Loop for an 18Mb 500MB/s DRAM", pp. 300–301, ISSCC94/Session 18/High Performance Logic & Circuit Techniques/Paper FA 18.6, IEEE International Solid-State Circuits Conference, 1994.

Avner Efendovich, Yachin Afek, Coby Sella, and Zeev Bikowsky, "Multi-Frequency Zero-Jitter Delay-Locked Loop", pp. 27.1.1–27.1.4, IEEE 1993 Custom Integrated Circuits Conference.

*Primary Examiner*—Margaret Rose Wambach
*Attorney, Agent, or Firm*—Edel M. Young; Michael A. Glenn

[57] ABSTRACT

An input clock delay circuit includes an up counter for estimating the approximate number of internal clock cycles that occur during one cycle of the input clock signal and another up counter for determining the portion of each cycle of the input clock signal that is high. A clock manipulation circuit receives each counter's value, and may be set to perform a fixed transform on the input clock signal, such as clock delay/advance, duty cycle shifting, and frequency multiplication/division. The clock manipulation circuit output values are loaded into two down counters that are also clocked by the internal clock. On the rising edge of the input clock signal, the first down counter starts decrementing until the counter reaches zero, indicating that the desired delay interval has passed, at which point the delayed output clock signal is taken high. The second down counter then starts decrementing for an interval that is equal to the desired duty cycle of the output clock signal. When the second down counter reaches zero, the output clock signal is taken low, and the process repeats.

27 Claims, 4 Drawing Sheets

PROGRAMMABLE CLOCK HAVING PROGRAMMABLE DELAY AND DUTY CYCLE BASED ON A USER-SUPPLIED REFERENCE CLOCK

BACKGROUND OF THE INVENTION

1. Technical Field

The present invention relates to the generation and supply of an output clock signal for digital circuits. More particularly, the present invention relates to the generation of a controllable clock delay, for example to compensate for clock skew resulting from clock distribution across a system having diverse elements.

2. Description of the Prior Art

Modern digital electronic computers are comprised of a number of cooperating sequential logic circuits that each perform several routine operations, and that are each controlled by derivatives of a common clock signal. The clock signals must be synchronized at predetermined locations within the system if the computer is to function optimally. Although the individual clock signals may have a common source, they often do not arrive at their intended destinations in proper synchronism, for example due to variations in signal propagation delay for each destination. Thus, combining several complex sequential logic circuits within a system presents a challenge with respect to synchronizing the time frames of each of the circuits with each other.

Because synchronous sequential logic circuits change states only at the rising or falling edge of a synchronous clock signal, proper circuit operation requires that any external input signals to the synchronous sequential logic circuit must generate valid inputs that occur with the proper set up time and hold time requirements relative to the designated clock edge. However, in a system comprised of sequential logic circuits having a master system clock that operates the several diverse system circuits there is a problem with skew between the system clock and the destination clock signals propagated through the various circuits.

As integration levels of microelectronic circuits and system complexity continues to increase, the routing or distribution of a master system clock becomes more critical. This problem is especially exacerbated in view of ever increasing clock rates. Thus, clock distribution in a complex integrated circuit requires careful selection of a routing scheme, including such considerations as distribution topography across the circuit surface, propagation delays in routing the clock signal to all elements on the circuit, desired set up and hold times, and variations in system design parameters, such as system clock rate, that can affect circuit operation.

The most common solution to this problem is to employ a voltage controlled oscillator in a phase-locked loop to adjust the various signals, such that the edges of the internal clock signals are aligned with those of the master or reference clock signal, even though the time frame of each signal is thereby shifted. The phase-locked loop provides feedback that is used to null out clock distribution delays within the circuit by comparing the phase of a first signal with that of a second signal. The difference between the two signals is used in a feedback control system to bring the first and second signals into a fixed phase relation. With regard to a clock distribution scheme, the first signal is typically a reference signal derived from the master system clock, and the second signal is typically a controlled signal of variable frequency.

Although analog phase-locked loops were first used in clock distribution circuits, digital phase-locked loops have gained wider acceptance. In such digital phase-locked loops, a digital phase detector is used, although the phase-locked loop architecture is otherwise composed of analog elements, i.e. voltage controlled oscillator, loop filter. See for example A. Wray, *Clock Synchronization Circuit for Digital Communications System*, UK Patent Application No. GB 9117645 (15 Aug. 1991) which discloses a burst-mode TDMA system including a clock synchronization circuit that provides a clock signal having a frequency that is greater than the signal frequency of the received data signal. An AND gate and divider logically combine the clock signal with the received data signal to provide a synchronization signal for the digital communications system. The synchronization signal is compared with the received data signal and an error signal is generated in response to the difference. Delay circuitry successively introduces delays to the clock signal to reduce the error in response to transitions of the synchronization word until the synchronization and received data signals are synchronized.

See, also M. Alsup, C. Dobbs, E. Haddad, C. Moughanni, Y. Wu, *Digital Phase Lock Clock Generator Without Local Oscillator*, U.S. Pat. No. 5,173,617 (22 Dec. 1992) (digital phase-locked loop including a phase detector that controls, and an up-down counter to program, an increase/decrease in a tapped delay line); J. Hjerpe, D. Russell, R. Young, *All Digital Phase-Locked Loop*, U.S. Pat. No. 5,109,394 (28 Apr. 1992) (digital phase-locked loop for synchronizing an output clock with a reference clock signal, including a multiple-tap, digital delay chain to delay the output clock signal); D. Preslar, *Digital Phase Comparator With Improved Sensitivity For Small Phase Differences*, U.S. Pat. No. 4,322,643 (30 Mar. 1982) (digital phase comparator for eliminating the dead zone in the phase correction means of a phase-locked loop); A. Efendovich, Y. Afek, C. Sella, Z. Bikowsky, *Multi-Frequency Zero-Jitter Delay-Locked Loop*, IEEE 1993 Custom Integrated Circuits Conference (1993) (all digital delay-locked loop); T. Lee. K. Donnelly, J. Ho, J. Zerbe, M. Johnson, T. Ishikawa, *A 2.5V Delay-Locked Loop for an 18 Mb 500 MB/s DRAM*, IEEE International Solid-State Circuits Conference (1994) (receive delay-locked loop); and A. Waizman, *A Delay Line Loop for Frequency Synthesis of De-Skewed Clock*, IEEE International Solid-State Circuits Conference (1994) (delay line loop clock generator circuit used for frequency synthesis multiplication of a de-skewed clock).

Modern computer system designs may specify a wide range of system clock rates, e.g. from 10-MHz or less to 100-MHz or more. When it is considered that clock distribution may consume 20% or more of a clock period, it is clear that clock delays, while not critical at slower clock rates (for example at 10-MHz, where a clock delay of 5 nsec is insignificant when compared to a clock period of 100 nsec), become extremely critical at faster clock rates (for example at 100-MHz, where a clock delay of 5 nsec is unacceptable when compared to a clock period of 10 nsec). While a phase-locked loop may include a series of tapped delays, such as buffers, voltage controlled delays, shift registers, and the like, to extend its range of operation, such expedients take up considerable space, while providing only a minimal amount of range of operation extension. Thus, while a phase-locked loop may be useful for a narrow range of system clock rates, it is not practical for complex integrated circuits that are intended for a wide variety of system applications over a broad range of system clock rates.

There is no need for a phase-locked loop having a voltage controlled oscillator if the system provides a master clock of the correct frequency, because the fundamental problem is aligning the edges of the system master clock precisely with those of the internal device clocks such that all system elements operate in synchronism. Accordingly, there is a need to synchronize (i.e. de-skew or match rising edges) output clock signals with that of a master clock in a precise and stable manner over a wide range of operating parameters and reference clock frequencies, so as to cancel uncertainty introduced by internal generated clock distribution delays.

SUMMARY OF THE INVENTION

The invention provides an input clock delay circuit that is constructed of relatively simple high speed counters. The delay circuit does not require feedback or the use of phase comparators and is therefore highly compact and thus well suited for use with integrated circuits. The delay circuit is self tuning based on an internal high speed clock having a period that defines the resolution of the delay, which is about 0.5 nsec in the exemplary embodiment of the invention. Additionally, the delay circuit is extremely stable and self correcting, such that adjustments for changes in supply voltage (Vcc) and temperature are not necessary, nor will such changes adversely affect circuit operation.

The delay circuit delays an input clock signal by a selected amount. This delay displaces the phase of the output clock signal produced by the circuit from that of the input clock signal by a selected amount, such that the output clock signal may appear at, before, or after the input clock signal. Thus, even though the input clock signal is delayed, the circuit may have the same effect as speeding up the clock signal.

An up counter is used to estimate the approximate number of internal clock cycles that occur during one cycle of the input clock signal. Another up counter is used to determine the portion of the input clock signal that is high, i.e. the duty cycle of the input clock signal. The two counts thus obtained are saved and routed to a clock manipulation logic circuit. The clock manipulation logic circuit may be set to perform a fixed transform on the input clock signal, or it may be programmable to any of several selectable input clock transforms, such as clock delay/advance, duty cycle shifting, and frequency multiplication/division.

The clock manipulation logic circuit produces two output signals that are loaded into two down counters that are also clocked by the internal clock. On the rising edge of the input clock signal, the first down counter starts decrementing until the counter reaches zero, indicating that the desired delay interval has passed, at which point the output clock signal is taken high. The second down counter then starts decrementing for an interval that is equal to the desired high portion of the output clock signal. When the second down counter reaches zero, the output clock signal is taken low, and the process repeats. All of the counters are reinitialized during every input clock cycle. The internal clock drives the counters to time a desired delay/duty cycle without the use of feedback, while the delay circuit is reset to the input clock signal on every cycle of the input clock signal.

BRIEF DESCRIPTION OF THE DRAWINGS

FIG. 1 is a block schematic diagram showing a programmable clock circuit having a programmable delay and duty cycle based on a user-supplied reference clock according to the present invention;

DETAILED DESCRIPTION OF THE INVENTION

The clock delay invention described herein provides a completely digital circuit constructed of relatively simple high speed counters. The circuit does not require feedback or the use of phase comparators and is therefore highly compact and thus well suited for incorporation into integrated circuits. The delay circuit is self tuning based on an internal high speed clock having a period that defines the resolution of the delay, which is about 0.5 nsec in the exemplary embodiment of the invention. Additionally, the delay circuit is extremely stable and self correcting, such that adjustment for changes in supply voltage (Vcc) and temperature are not necessary.

Figure 1A:
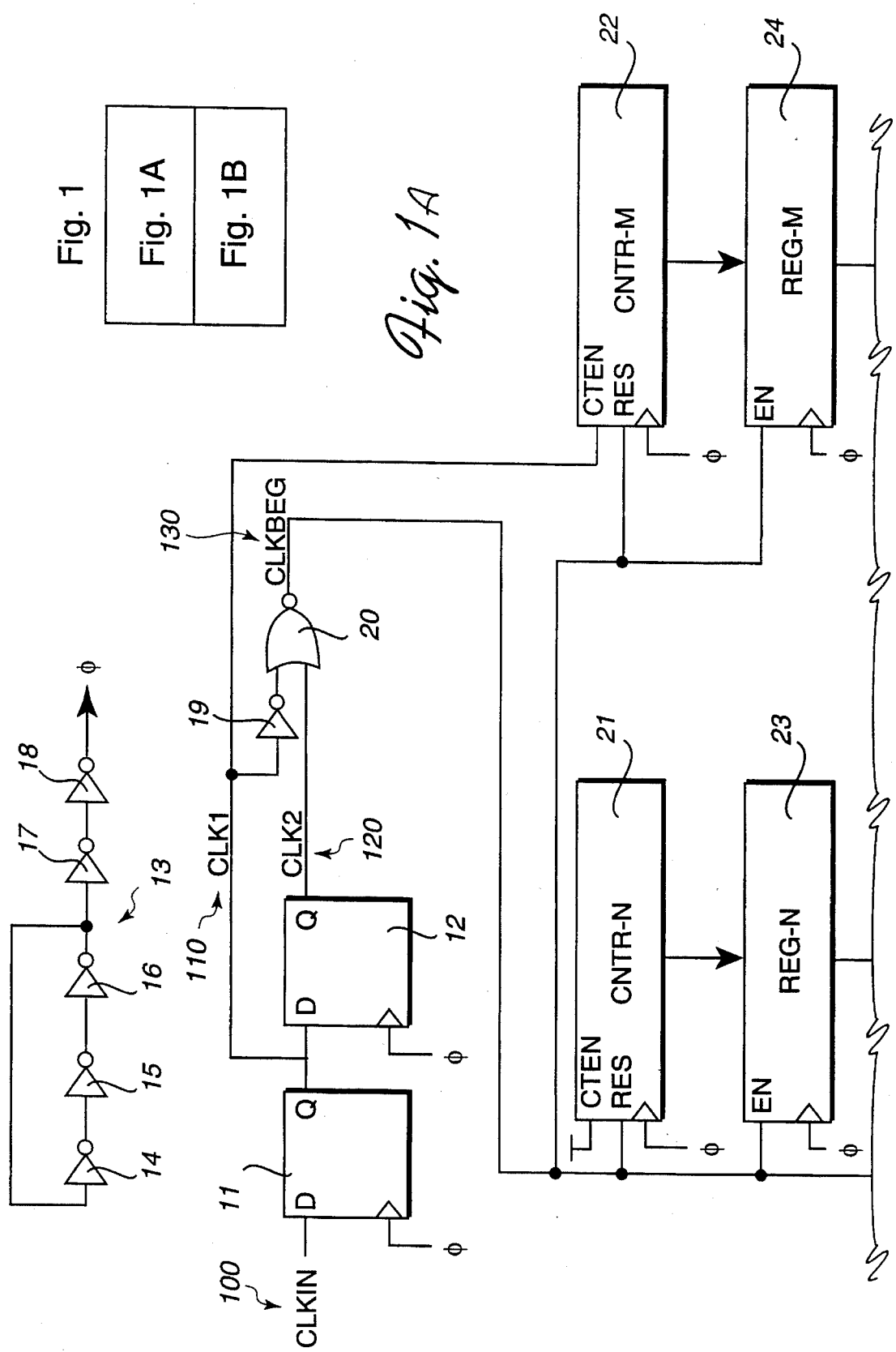
FIGS. 1A and 1B show the particular structure of FIG. 1.
Figure 1B:
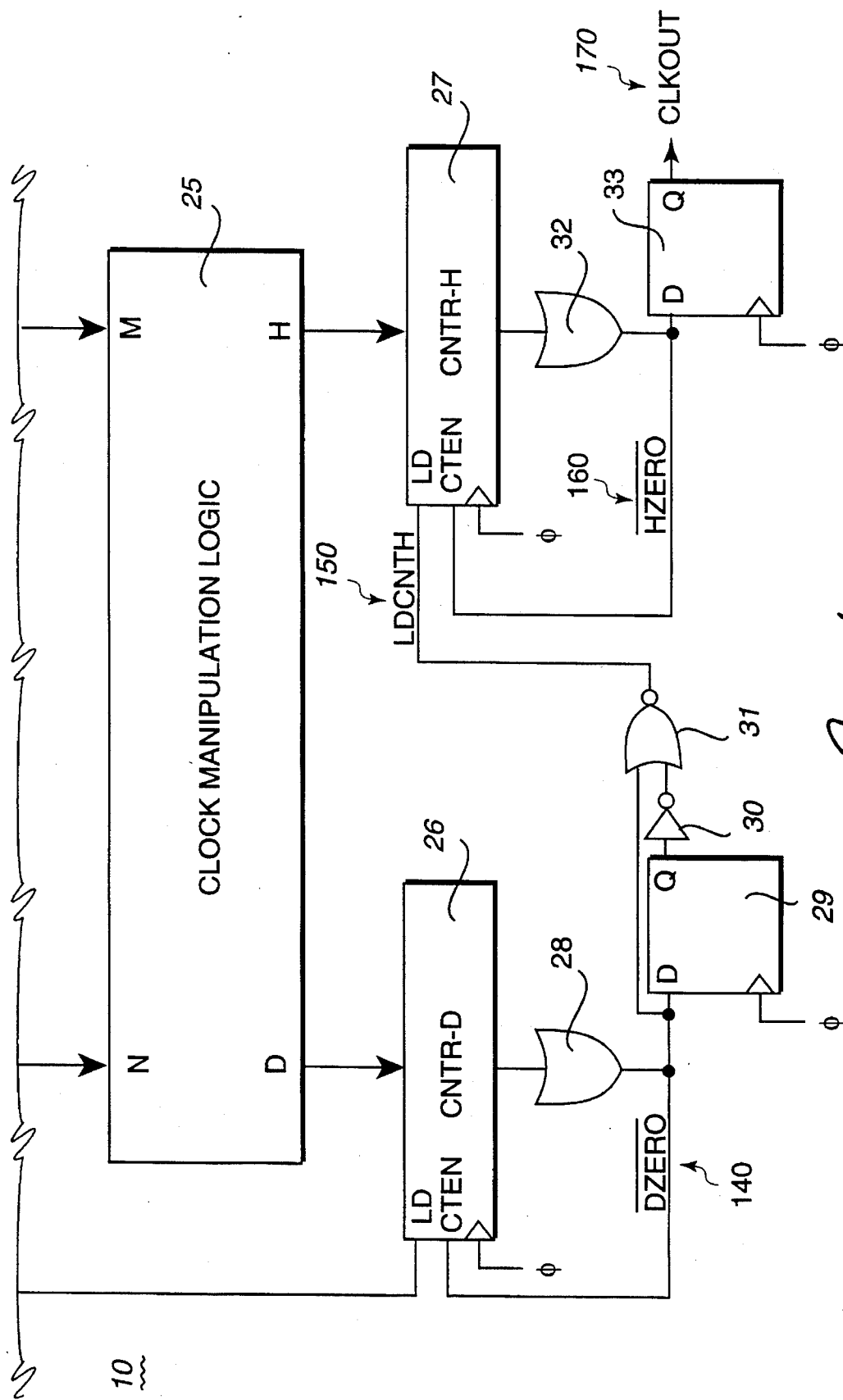

FIG. 1 is a block schematic diagram showing a programmable clock circuit 10 having a programmable delay and duty cycle based on a user-supplied reference clock according to the present invention. A fast internal clock signal $\phi$ is generated by an oscillator circuit 13 that consists of a plurality of series connected buffers 14–18. In the exemplary embodiment of the invention, the internal clock signal $\phi$ has a period of about 0.5 nsec, although any other clock period may be chosen, depending upon the application to which the invention is put.

The internal clock signal $\phi$ is routed throughout the programmable clock circuit to operate the circuit independently of an input clock signal, e.g. CLKIN 100. Thus, the invention provides a clock delay circuit that is insensitive to changes in supply voltage and temperature because the circuit is driven by the same internal clock signal, such that variations attributable to changes in supply voltage and temperature are uniformly reflected consistently in operation of the circuit and independently of the input clock signal CLKIN. Additionally, because the circuit is reset during each input clock cycle, the circuit always tracks the input clock signal accurately.

All counters and registers used in the clock delay circuit (as discussed below) should be able to handle a wide range of CLKIN periods relative to the internal clock signal $\phi$. This is especially true for slow input clock signals. For example, if the period of the internal clock signal $\phi$ is 0.5 nsec, then CLKIN periods as slow as 2 seconds may be handled by the circuit if 32-bit counters are used in the clock delay circuit, e.g. 232*0.5 nsec=2.1 sec.

The CLKIN signal 100 is routed to a first D flip flop 11. The output of the flip flop 11 is designated as the CLK1 signal 110, and is routed to a second D flip flop 12, to the enable terminal CTEN of a counter CNTR-M 22, and through an inverter to a first input terminal of a NOR gate 20. The output of the flip flop 12 is designated as the CLK2 signal 120, and is routed to a second input terminal of the NOR gate 20. The output of the NOR gate is designated as the CLKBEG signal 130, and is routed to the RES terminal of the counters CNTR-M 22 and CNTR-N 21 to reset the two counters. The CLKBEG signal is also routed to an enable terminal EN of the registers 23 and 24 for storing the REG-N and REG-M signals, and to a load terminal LD of the counter CNTR-D 26. Note that all the control inputs to these counters and registers, including CTEN, RES, EN, and LD, are synchronous signals that only take effect on the next rising clock.

After the circuit is reset by the CLKBEG signal, the counter CNTR-M 22, which is enabled by the CLK1 signal, begins counting up and continues counting until the signal CLK1 falls. The counter CNTR-N 21, which has its enable terminal EN held high and is therefore always enabled, begins counting up after receipt of the CLKBEG signal, and continues counting until it is reset by the next CLKBEG signal.

The value attained by each of the counters 21, 22 is stored in the registers 23, 24 respectively. Thus, the register 24 stores a count value M that represents the interval of the period for the clock signal CLKIN that the signal is high, while the register 23 stores a count value N that represents the total period of the clock signal CLKIN. The values in each register are transferred to the clock manipulation logic circuit 25 by the next occurrence of the CLKBEG signal.

The clock manipulation logic circuit 25 allows fixed or programmed control of the output clock signal CLKOUT produced by the clock delay circuit 10. Thus, the counter values N and M that are routed to the clock manipulation circuit may be subjected to any of various transforms or manipulations to delay the input clock signal, modify the input clock signal duty cycle, or increase/decrease the input clock signal frequency.

The clock manipulation logic circuit 25 provides two output values D and H that are routed to the counters CNTR-D 26 and CNTR-H 27, respectively. When the CLKBEG signal is provided, the counter CNTR-D 26 is loaded with the value D. The counter 26 produces an output value where all the bits are ORed together by an OR gate 28 to provide the signal $\overline{\text{DZERO}}$ 140, such that when the counter is at "0", $\overline{\text{DZERO}}$ is low. The signal $\overline{\text{DZERO}}$ is routed to the enable terminal CTEN of the counter CNTR-D 26, to the input of the D flip flop 29, and to a first input terminal of the NOR gate 31. After receiving a value D, the counter CNTR-D counts down until the value contained within the counter is equal to zero. The time it takes to count down to zero offsets the output clock signal CLKOUT from the input clock signal CLKIN by a desired amount, and therefore the value D is selected to specify a desired amount of delay. Once the counter has reached zero, the CLKOUT signal is brought high.

The output of the flip flop 29 is routed through an inverter 30 to a second input of the NOR gate 31. The output of the NOR gate 31 provides the LDCNTH signal 150 that is routed to the load terminal LD of the counter CNTR-H 27. In response to a high signal, counter CNTR-H is loaded with the value H and produces an output signal where all the bits are ORed together by an OR gate 32 to provide a signal that is designated as the $\overline{\text{HZERO}}$ signal 160. The $\overline{\text{HZERO}}$ signal is routed to the enable terminal CTEN of the counter CNTR-H such that the counter begins counting down from the value H. The $\overline{\text{HZERO}}$ signal is also routed to the input terminal of a D flip flop 33, and thence output from the delay circuit 10 as the CLKOUT signal 170. The CLKIN signal is delayed by the value D and has a high level duration, i.e. duty cycle H, as provided by the CLKOUT signal.

Some examples are shown in Table 1 below. The examples provide various input clock signal transforms. To cause CLKOUT to equal CLKIN, D is set to zero. To delay CLKIN by ½ a period, D is set to N/2. It should be appreciated that the invention allows a virtually unlimited number of selected clock manipulations, depending upon the application to which the invention is put. It should also be appreciated that the various operations necessary to perform such manipulations, such as divide by N (where N=2, 4, . . . ), are readily implemented by those skilled in the art using standard logic components.

TABLE 1

| Clock Manipulation Operations | | |
|---|---|---|
| CLKOUT | D | H |
| CLKOUT = CLKIN | 0 | M |
| CLKIN delayed by ½ period | N/2 | M |
| CLKIN delayed by ¼ period, 50% duty cycle | N/4 | N/2 |

Figure 2:
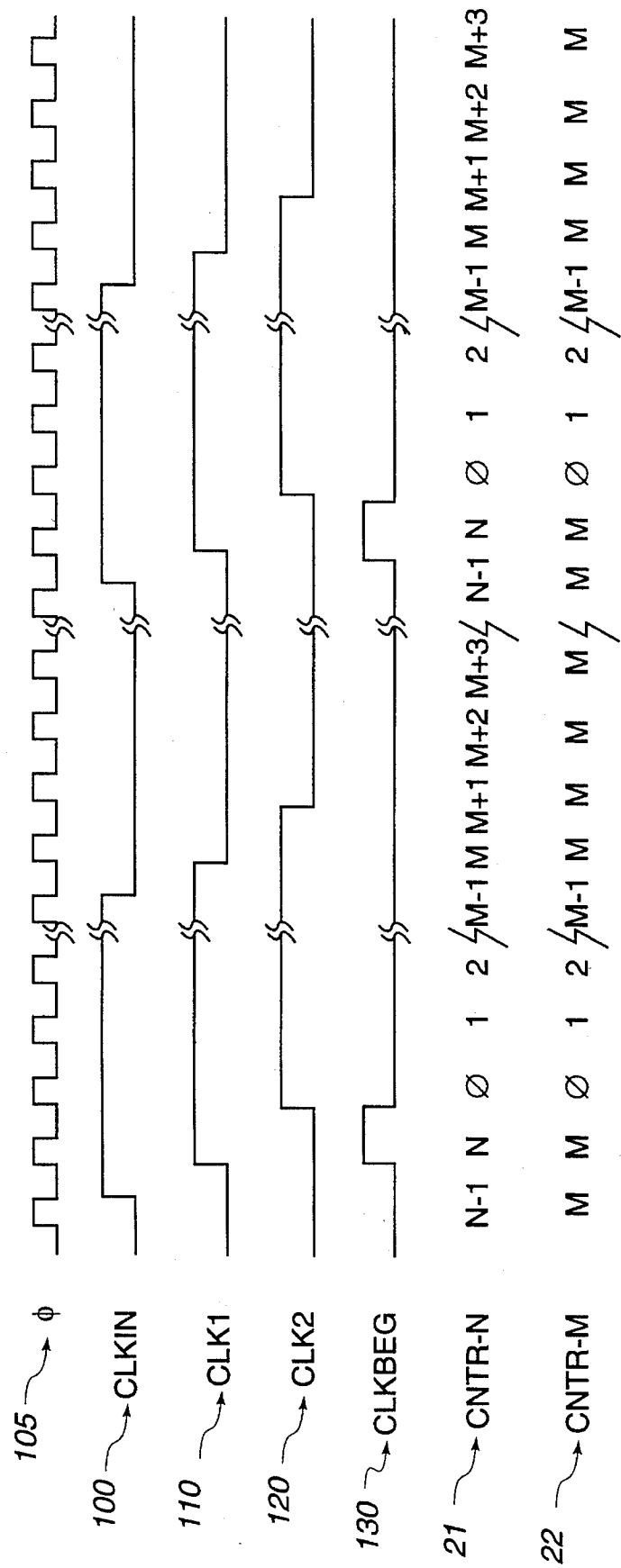
FIG. 2 is a timing diagram showing the various timing relations for computing values for the signals M and N shown in FIG. 1, according to the present invention.

FIG. 2 is a timing diagram showing the various timing relations for computing values for the signals M and N shown in FIG. 1, according to the present invention. In FIG. 2, signals that are also shown in FIG. 1 are identified with the same numeric designator. The value N represents the period of the CLKIN signal 100 measured in cycles of the internal clock signal $\phi$; the value M represents the high level duration of the CLKIN signal. The CLK1 signal 110 follows the CLKIN signal as synchronized to the internal clock signal $\phi$; the CLK2 signal 120 is identical to the CLK1 signal delayed by one cycle; and the CLKBEG 130 signal is approximately synchronized to the $\phi$ signal rising edge and has the period of the CLKIN signal. Both of the counters CNTR-N 21 and CNTR-M 22 are synchronously reset by the CLKBEG signal. Counter CNTR-N counts continuously after it is reset, while counter CNTR-M stops counting when the CLK1 signal falls. Thus, the value in counter CNTR-N rises to the number of internal clock cycles of the internal clock signal $\phi$ that occur during one cycle of the input clock signal CLKIN; while the value in counter CNTR-M rises to the number of internal cycles of clock signal $\phi$ the CLKIN signal is high.

Figure 3:
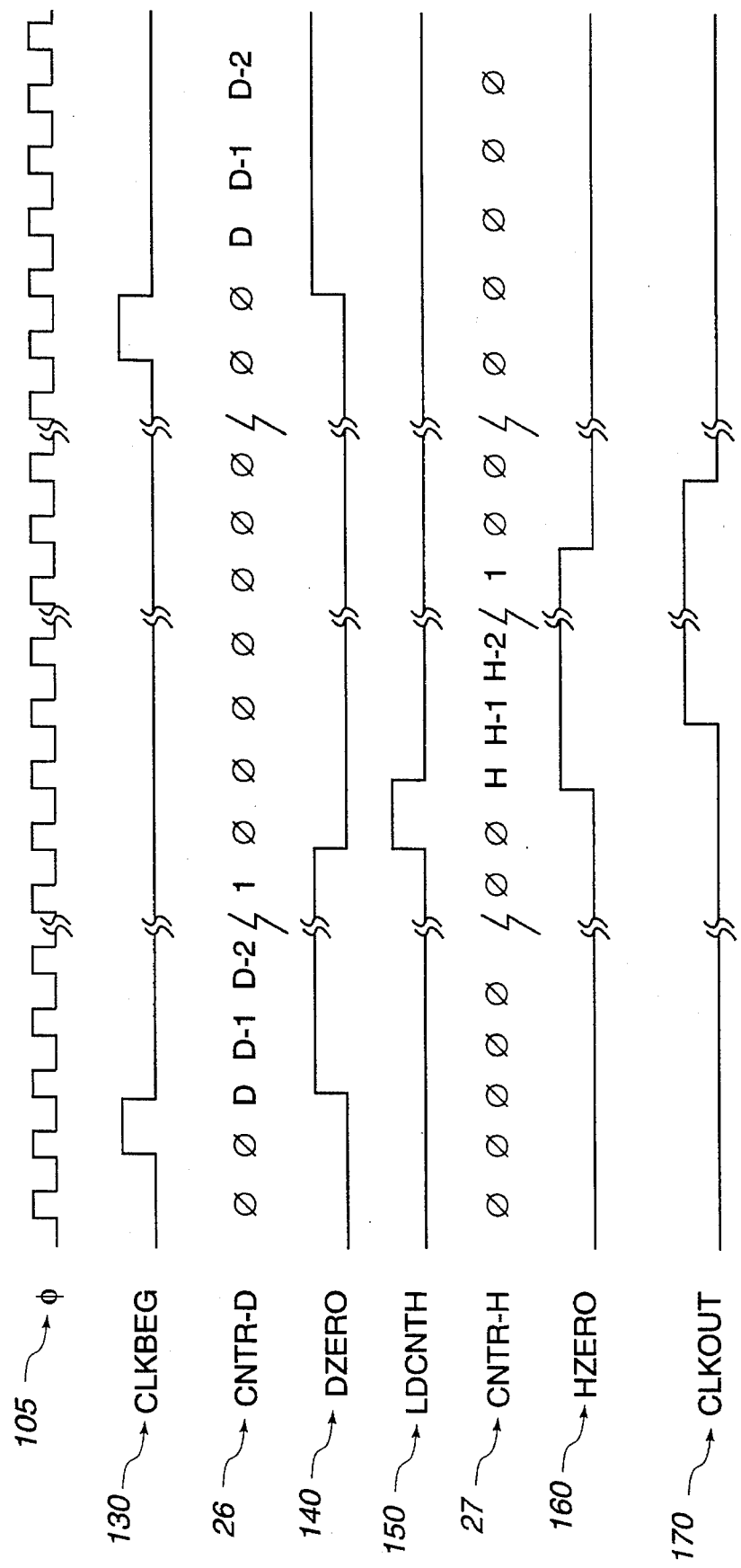
FIG. 3 is a timing diagram showing the various timing relations for computing values for the CLKOUT signal from the signals D and H shown in FIG. 1, according to the present invention.

FIG. 3 is a timing diagram showing signals which determine the CLKOUT signal from the counts D and H on output terminals of clock manipulation logic circuit 25 of FIG. 1. Internal clock signal $\phi$ is shown to be a relatively high frequency clock signal. In response to a rising CLKIN signal (not shown in FIG. 3), a positive pulse occurs in the CLKBEG signal, which causes the count D to be loaded into counter CNTR-D. Signal $\overline{\text{DZERO}}$ (the output of NOR gate 28) goes high in response to the value of count D being non-zero and remains high until the value of D goes to zero. The low going value of signal $\overline{\text{DZERO}}$ causes the LDCNTH signal to go high, which loads the value H into counter CNTR-H. This value is applied to OR gate 32 and causes the $\overline{\text{HZERO}}$ signal to go high. Thus, count D delays the rising edge of output signal CLKOUT relative to the rising edge of input signal CLKIN, and count H controls the length of the positive portion of output signal CLKOUT.

The value for the signal H is identical to that portion of each cycle of the output clock signal CLKOUT that the output clock signal is high. When the CLKBEG signal is equal to a logic one, the counter CNTR-D starts counting down from D to compute the amount by which the output signal CLKOUT is to be delayed from the input signal CLKIN by the delay circuit. When the counter CNTR-D reaches zero, the output signal CLKOUT rises. At that point, the counter CNTR-H begins counting down to compute the time when the CLKOUT signal should fall again, i.e. that portion of the output clock cycle that is high.

Although the invention is described herein with reference to the preferred embodiment, one skilled in the art will readily appreciate that other applications may be substituted for those set forth herein without departing from the spirit and scope of the present invention. For example, the invention is readily used for such clock signal processing as generating clock delay, adjusting clock duty cycle, shifting clock phase, and increasing or decreasing the clock frequency, e.g. by using other values or by updating the down counters more or less frequently. Additionally, the various trigger signals, such as rising edge and falling edge transitions may be chosen as desired, and need not be limited to those trigger signals described herein in connection with the exemplary embodiment of the invention, e.g. the falling edge of the CLKBEG signal could reset the delay circuit. Accordingly, the invention should be limited only by the claims included below.

I claim:

1. A circuit in an integrated circuit for selectively transforming an input clock signal, comprising:

an internal oscillator that generates an internal clock signal;

a first counter adapted to count each cycle of said internal clock signal and to generate an output signal corresponding thereto;

a clock manipulation logic circuit adapted to receive the output signal produced by said first counter, and for producing a first transform value from the output signal and the input clock signal; and a second counter adapted to receive said first transform value from said clock manipulation logic circuit and for delaying generation of a clock circuit output signal until said second counter has counted to a value that is equal to said first transform value.

2. The circuit of claim 1, further comprising:

a first register for temporarily storing said first counter output signal; and a second register for temporarily storing said second counter output signal.

3. The circuit of claim 1, wherein a duty cycle of said input clock signal is transformed by said clock manipulation logic circuit.

4. The circuit of claim 1, wherein said input clock signal is delayed by said clock manipulation logic circuit.

5. The circuit of claim 1, wherein said input clock signal is multiplied by said clock manipulation logic circuit.

6. The circuit of claim 1, wherein said input clock signal is divided by said clock manipulation logic circuit.

7. The circuit of claim 1, wherein said internal clock further comprises an oscillator circuit.

8. The circuit of claim 7, wherein said oscillator has a period of about 0.5 nsec.

9. The circuit of claim 1, further comprising:

a third counter adapted to receive a second transform value from said clock manipulation logic circuit and for maintaining said clock circuit output signal in one of a high state or low state until said third counter has counted to a value that is equal to said second transform value.

10. A circuit in an integrated circuit for selectively transforming an input clock signal, comprising:

an internal oscillator that generates an internal clock signal;

a first counter adapted to count each cycle of said internal clock signal and to generate an output signal corresponding thereto;

a clock manipulation logic circuit adapted to receive the output signal produced by said first counter, and for producing a first transform value from the output signal and the input clock signal; and a second counter adapted to receive a first transform value from said clock manipulation logic circuit and for maintaining said clock circuit output signal in one of a high state or low state until said second counter has counted to a value that is equal to said first transform value.

11. The circuit of claim 10, wherein a duty cycle of said input clock signal is transformed by said clock manipulation logic circuit.

12. The circuit of claim 10, wherein said input clock signal is delayed by said clock manipulation logic circuit.

13. The circuit of claim 10, wherein said input clock signal is multiplied by said clock manipulation logic circuit.

14. The circuit of claim 10, wherein said input clock signal is divided by said clock manipulation logic circuit.

15. The circuit of claim 10, wherein said internal clock further comprises an oscillator circuit.

16. The circuit of claim 15, wherein said oscillator has a period of about 0.5 nsec.

17. The circuit of claim 10, further comprising:

a third counter adapted to receive a second transform value from said clock manipulation logic circuit and for delaying generation of a clock circuit output signal until said third counter has counted to a value that is equal to said second transform value.

18. A circuit for selectively transforming an input clock signal, comprising:

an internal clock that operates at a rate which is fast with respect to the rate of said input clock signal, said internal clock generating an internal clock signal;

a first up counter adapted to count each cycle of said internal clock signal that is generated during each input clock cycle and to generate an output signal corresponding thereto;

a first register for temporarily storing said first up counter output signal;

a second up counter adapted to count each cycle of said internal clock signal that is generated during each input clock cycle only while said input clock is in one of a high or low state and to generate an output signal corresponding thereto;

a second register for temporarily storing said second up counter output signal;

a clock manipulation logic circuit adapted to receive the output signals produced by said first and second up counters from said first and second registers during each input clock cycle, and for producing an input clock signal transform therefrom;

a first down counter adapted to receive a first transform value from said clock manipulation logic circuit and for delaying generation of a clock circuit output signal until said first down counter has counted down to zero; and a second down counter adapted to receive a second transform value from said clock manipulation logic circuit and for maintaining said clock circuit output signal in one of a high state or low state until said second down counter has counted down to zero.

19. The circuit of claim 18, further comprising:

an input logic circuit adapted to receive said input clock signal, said input logic circuit producing a CLK1 signal therefrom, said CLK1 signal operable to enable said second up counter; and said input logic circuit producing a CLKBEG signal therefrom, said CLKBEG signal operable to reset said first and second up counters, and to load said first transform value to said first down counter from said clock manipulation logic circuit.

20. The circuit of claim 18, further comprising:

an output logic circuit adapted to receive a $\overline{\text{DZERO}}$ signal from said first down counter, said $\overline{\text{DZERO}}$ signal operable to enable said first down counter; and for generating a LDCNTH from said $\overline{\text{DZERO}}$ signal, said LDCNTH signal operable load said second transform value to said second down counter from said clock manipulation logic circuit.

21. The circuit of claim 18, wherein said clock manipulation logic circuit is adapted to selectively perform any of the following input clock signal transforms: input clock signal duty cycle adjustment, input clock signal delay, input clock signal advance, input clock signal multiplication, and input clock signal division.

22. The circuit of claim 18, wherein said internal clock further comprises an oscillator circuit.

23. The circuit of claim 22, wherein said oscillator has a period of about 0.5 nsec.

24. A method for selectively transforming an input clock signal, comprising the steps of:

generating an internal clock signal at a rate which is fast with respect to the rate of said input clock signal;

counting each cycle of said internal clock signal that is generated during each input clock cycle with a first counter and generating an output signal corresponding thereto;

receiving the output signal produced by said first counter during each input clock cycle, and producing an input clock signal transform therefrom;

receiving a first transform value from a clock manipulation logic circuit at a second counter and delaying generation of a clock circuit output signal until said second counter has counted to a value that is equal to said first transform value; and receiving a second transform value from said clock manipulation logic circuit at a third counter and maintaining said clock circuit output signal in one of a high state or low state until said third counter has counted to a value that is equal to said second transform value.

25. The method of claim 24, wherein said input clock signal duty cycle is transformed during said producing step.

26. The method of claim 24, wherein said input clock signal is delayed during said producing step.

27. The method of claim 24, wherein said input clock signal is multiplied during said producing step.

* * * * *

UNITED STATES PATENT AND TRADEMARK OFFICE
CERTIFICATE OF CORRECTION

PATENT NO. : 5,506,878

DATED : April 9, 1996

INVENTOR(S) : David Chiang

It is certified that error appears in the above-identified patent and that said Letters Patent is hereby corrected as shown below:

Col. 4, line 54, "232*0.5 nsec=2.1 sec." should read -- $2^{32}*0.5$ nsec=2.1 sec. --.

Signed and Sealed this

Twenty-fifth Day of November, 1997

Attest:

BRUCE LEHMAN

Attesting Officer

Commissioner of Patents and Trademarks